United States Patent [19]
Buechele et al.

[11] Patent Number: 6,062,135
[45] Date of Patent: May 16, 2000

[54] SCREENING APPARATUS INCLUDING A DUAL RESERVOIR DISPENSING ASSEMBLY

[75] Inventors: Alvin W. Buechele, Clinton Corners; Karl O. Muggenburg, Salt Point; James C. Utter, Fishkill; Renee L. Weisman, Poughkeepsie, all of N.Y.

[73] Assignee: International Business Machines Corporation, Armonk, N.Y.

[21] Appl. No.: 09/206,158

[22] Filed: Dec. 7, 1998

[51] Int. Cl.[7] .................................................. B41M 1/12
[52] U.S. Cl. ........................ 101/129; 101/123; 118/301; 118/256
[58] Field of Search ................................. 101/114, 123, 101/124, 129; 118/210, 213, 216, 221, 301, 241, 242, 256, 406, 422

[56] References Cited

U.S. PATENT DOCUMENTS

| | | | |
|---|---|---|---|
| 3,827,602 | 8/1974 | Nicholls | 222/137 |
| 4,025,669 | 5/1977 | Greenstein | 427/226 |
| 4,040,420 | 8/1977 | Speer | 128/218 M |
| 4,261,481 | 4/1981 | Speer | 222/135 |
| 4,324,815 | 4/1982 | Mitani et al. | 427/96 |
| 4,362,486 | 12/1982 | Davis et al. | 425/110 |
| 4,419,168 | 12/1983 | Paul | 118/213 |
| 4,801,434 | 1/1989 | Kido et al. | 422/100 |
| 4,949,874 | 8/1990 | Fiedler et al. | 222/135 |
| 5,078,082 | 1/1992 | Soerewyn | 118/213 |
| 5,202,153 | 4/1993 | Siuta | 427/125 |
| 5,290,259 | 3/1994 | Fischer | 604/218 |
| 5,293,504 | 3/1994 | Knickerbocker et al. | 174/262 |
| 5,395,040 | 3/1995 | Holzmann | 118/213 |
| 5,565,033 | 10/1996 | Gaynes et al. | 118/210 |
| 5,639,562 | 6/1997 | Natarajan | 428/545 |
| 5,683,014 | 11/1997 | Smolen, Jr. et al. | 222/137 |
| 5,802,970 | 9/1998 | Tani | 101/123 |
| 5,806,423 | 9/1998 | Tani | 101/123 |

OTHER PUBLICATIONS

IBM Technical Disclosure Bulletin, vol. 28, No. 2 Jul. 1985, pp. 808–809, "QUICK–CHANGE PASTE DISPENSER WITH MIXER".

IBM Technical Disclosure Bulletin, vol. 14, No. 3, Aug. 1971, p. 739, "EXTRUSION SCREENING NOZZLE", S. W. Cornell, et al.

*Primary Examiner*—Ren Yan
*Attorney, Agent, or Firm*—Ira D. Blecker

[57] ABSTRACT

A screening apparatus including a table for holding an article; and a dual reservoir dispensing assembly. The dual reservoir assembly includes first and second reservoirs for holding first and second materials to be dispensed; first and second nozzles in communication with first and second reservoirs, respectively, for dispensing first and second materials; tilting apparatus for tilting the nozzles in a first direction so that the first nozzle is tilted into position for dispensing the first material and for tilting the nozzles in a second direction so that the first nozzle is tilted out of position and the second nozzle is tilted into position for dispensing the second material; and apparatus for moving the dual reservoir dispensing assembly with respect to the table wherein, in operation, the first nozzle is tilted into position during a first movement across the article and the second nozzle is titled into position during a second movement across the article.

19 Claims, 6 Drawing Sheets

SCREENING APPARATUS INCLUDING A DUAL RESERVOIR DISPENSING ASSEMBLY

RELATED APPLICATION

This application is related to Blazick et al. U.S. patent application Ser. No. 09/206,159 entitled "SINGLE MASK SCREENING PROCESS AND STRUCTURE PRODUCED THEREBY" (IBM Docket No. FI9-98-114), filed even date herewith, the disclosure of which is incorporated by reference herein.

BACKGROUND OF THE INVENTION

This invention relates to an apparatus for screening material onto a workpiece and, more particularly, relates to an apparatus for sequentially screening two different types of material onto a workpiece.

Extrusion and mesh (or silk) screening are the two major techniques in the electronics industry today for personalizing ceramics. Extrusion screening is achieved by mechanically forcing paste from a reservoir through a nozzle onto a metallic mask/stencil. Mesh screening utilizes a polyurethane-based nozzle chamfered at approximately a 45 degree angle to both push the paste along and through a silk mesh/stencil. Apparatus for screening is described in Davis et al. U.S. Pat. No. 4,362,486, the disclosure of which is incorporated by reference herein.

Glass, ceramic, glass ceramic and aluminum nitride (hereafter just ceramic) structures are used in the production of electronic substrates and devices for electronics packaging applications. Many different types of structures can be used. For example, a multilayered ceramic circuit substrate may comprise patterned metal layers which act as electrical conductors sandwiched between ceramic layers which act as insulators. The substrates are designed with termination pads for attaching semiconductor chips, capacitors, resistors, connection leads, pins, solder balls, solder columns etc. Interconnection between buried conductor levels can be achieved through vias formed by metal paste-filled holes in the individual ceramic layers formed prior to lamination, which, upon sintering will become a sintered dense metal interconnection of metal based conductor.

The termination pads are often multi-layered stacks of metallization and are conventionally produced with multiple screenings, with the underlying layer being screened and dried before application of another mask and screening and drying of the next layer. Greenstein U.S. Pat. No. 4,025,669, Siuta U.S. Pat. No. 5,202,153, and Knickerbocker et al. U.S. Pat. No. 5,293,504, the disclosures of which are incorporated by reference herein, are examples where multiple screenings have been utilized to obtain either a thicker layer or a multiple layer stack of metallization.

While the prior art shows the individual layers of the stack to be perfectly aligned with every other layer in the stack, the reality is very far from this ideal case. For example, Natarajan et al. U.S. Pat. No. 5,639,562, the disclosure of which is incorporated by reference herein, shows a two layer composite metal pad with both layers perfectly aligned.

Gaynes et al. U.S. Pat. No. 5,565,033, the disclosure of which is incorporated by reference herein, discloses a process for making thicker layers of solder pastes and conductive adhesives. In one embodiment, a flexible TEFLON material (TEFLON, a tetrafluoroethylene (TFE) compound, is a trademark of E.I. duPont de Nemours & Co.) is uses as the trailing lip of the screening nozzle. Gaynes et al. recognizes the disadvantages of multiple screenings, namely, contamination between successively screened layers and the time associated with two passes through screening and drying.

In practice, the individual layers may be shifted from the layer above or below it. Mitani et al. U.S. Pat. No. 4,324,815, the disclosure of which is incorporated by reference herein, recognizes the positional error that can occur with each printing step. As disclosed in Mitani et al., the bottom layer could be made larger than the top layer so that the top layer is "captured" by the bottom layer.

However, with the trend to increasing the density of the termination pads (and reducing the spacing between adjoining termination pads), it is no longer possible to oversize the bottom layer to capture the top layer.

Disclosed in IBM Technical Disclosure Bulletin, 28, No. 2, pp. 808-809 (July 1985), the disclosure of which is incorporated by reference herein, is a conventional screening apparatus for screening a paste onto ceramic greensheets. The reservoir for the disclosed apparatus only contains a single paste. Thus, each time a layer of paste is deposited, the paste dispenser needs to be changed before the next layer of paste could be deposited. Obviously, changing the paste dispenser after each layer of paste is deposited is time consuming and ultimately adds to the manufacturing cost of producing the finished part.

Cornell et al. IBM Technical Disclosure Bulletin, 14, No. 3, p. 739 (August 1971), the disclosure of which is incorporated by reference herein, discloses an extrusion screening nozzle having a TEFLON material tip for uniform wiping of the screening paste from the mask.

The art is replete with apparatus for dispensing two different kinds of materials. Typically, these prior art apparatus dispense the two different kinds of material simultaneously and/or side-by-side each other. Examples of such apparatus are Nicholls U.S. Pat. No. 3,827,602, Speer U.S. Pat. No. 4,040,420, Speer U.S. Pat. No. 4,261,481, Kido et al. U.S. Pat. No. 4,801,434, Fiedler et al. U.S. Pat. No. 4,949,874, Fischer U.S. Pat. No. 5,290,259 and Smolen, Jr. et al. U.S. Pat. No. 5,683,014, the disclosures of which are incorporated by reference herein.

It would be desirable to be able to sequentially lay down two different layers of paste without having to change the paste dispenser. It would further be desirable to be able to lay down two different layers of paste on top of each other without having to change the paste dispenser.

Accordingly, it is a purpose of the present invention to have an apparatus that is capable of sequentially laying down two different layers of paste without having to change the paste dispenser.

It is another purpose of the present invention to have an apparatus that is capable of laying down two different layers of paste in complete registration with each other without having to change the paste dispenser.

BRIEF SUMMARY OF THE INVENTION

One aspect of the invention relates to a screening apparatus comprising:
a table for holding an article; and
a dual reservoir dispensing assembly comprising:
  a first reservoir for holding a first material to be dispensed;
  a first nozzle in communication with the first reservoir wherein upon a predetermined command, the first material in the first reservoir is dispensed through the first nozzle;

a second reservoir for holding a second material to be dispensed;

a second nozzle in communication with the second reservoir wherein upon a predetermined command, the second material in the second reservoir is dispensed through the second nozzle;

a tilt means for tilting the nozzles, wherein upon a first predetermined command, the tilt means tilting the nozzles in a first direction so that the first nozzle is tilted into position for dispensing the first material, wherein upon a second predetermined command, the tilt means tilting the nozzles in a second direction so that first nozzle is tilted out of position and the second nozzle is tilted into position for dispensing the second material; and means for moving the dual reservoir dispensing assembly with respect to the table wherein, in operation, the first nozzle is tilted into position during a first movement across the article and the second nozzle is titled into position during a second movement across the article.

A second aspect of the invention relates to a dual reservoir dispensing assembly comprising:

a first reservoir for holding a first material to be dispensed;

a first nozzle in communication with the first reservoir wherein upon a predetermined command, the first material in the first reservoir is dispensed through the first nozzle;

a second reservoir for holding a second material to be dispensed;

a second nozzle in communication with the second reservoir wherein upon a predetermined command, the second material in the second reservoir is dispensed through the second nozzle;

a tilt means for tilting the nozzles, wherein upon a first predetermined command, the tilt means tilting the nozzles in a first direction so that the first nozzle is tilted into position for dispensing the first material, wherein upon a second predetermined command, the tilt means tilting the nozzles in a second direction so that the first nozzle is tilted out of position and the second nozzle is tilted into position for dispensing the second material.

A third aspect of the invention relates to a method of screening an article with a dual reservoir dispensing assembly comprising a first reservoir for holding a first material to be dispensed; a first nozzle in communication with the first reservoir wherein upon a predetermined command, the first material in the first reservoir is dispensed through the first nozzle; a second reservoir for holding a second material to be dispensed; a second nozzle in communication with the second reservoir wherein upon a predetermined command, the second material in the second reservoir is dispensed through the second nozzle; a tilt means for tilting the nozzles, wherein upon a first predetermined command, the tilt means tilting the nozzles in a first direction so that the first nozzle is tilted into position for dispensing the first material, wherein upon a second predetermined command, the tilt means tilting the nozzles in a second direction so that the first nozzle is tilted out of position and the second nozzle is tilted into position for dispensing the second material, the method comprising the steps of:

placing an article to be screened onto a table;

placing a dual reservoir dispensing assembly into a starting position;

tilting the nozzles so that the first nozzle is tilted into position for dispensing a first material;

traversing the dual reservoir dispensing assembly across the article to be screened in a first direction while dispensing a first material onto the article;

tilting the nozzles so that the second nozzle is tilted into position for dispensing a second material; and traversing the dual reservoir dispensing assembly across the article to be screened in a second direction while dispensing a second material onto the article.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention is directed to an advancement in the screening of greensheets in the fabrication of multilayer ceramic substrates or chip carriers. Thus, the present invention has the capability of screening two different materials on the same greensheet, overprinting one material directly over another material on consecutive screening passes, or screening selected greensheets in the same batch with either of two different materials.

It should be understood, however, that while the present invention is preferably directed to screening, and most preferably directed to extrusion screening, of greensheets, the present invention may also have applicability to any use where it is desirable to lay down two different layers of material.

Figure 1:
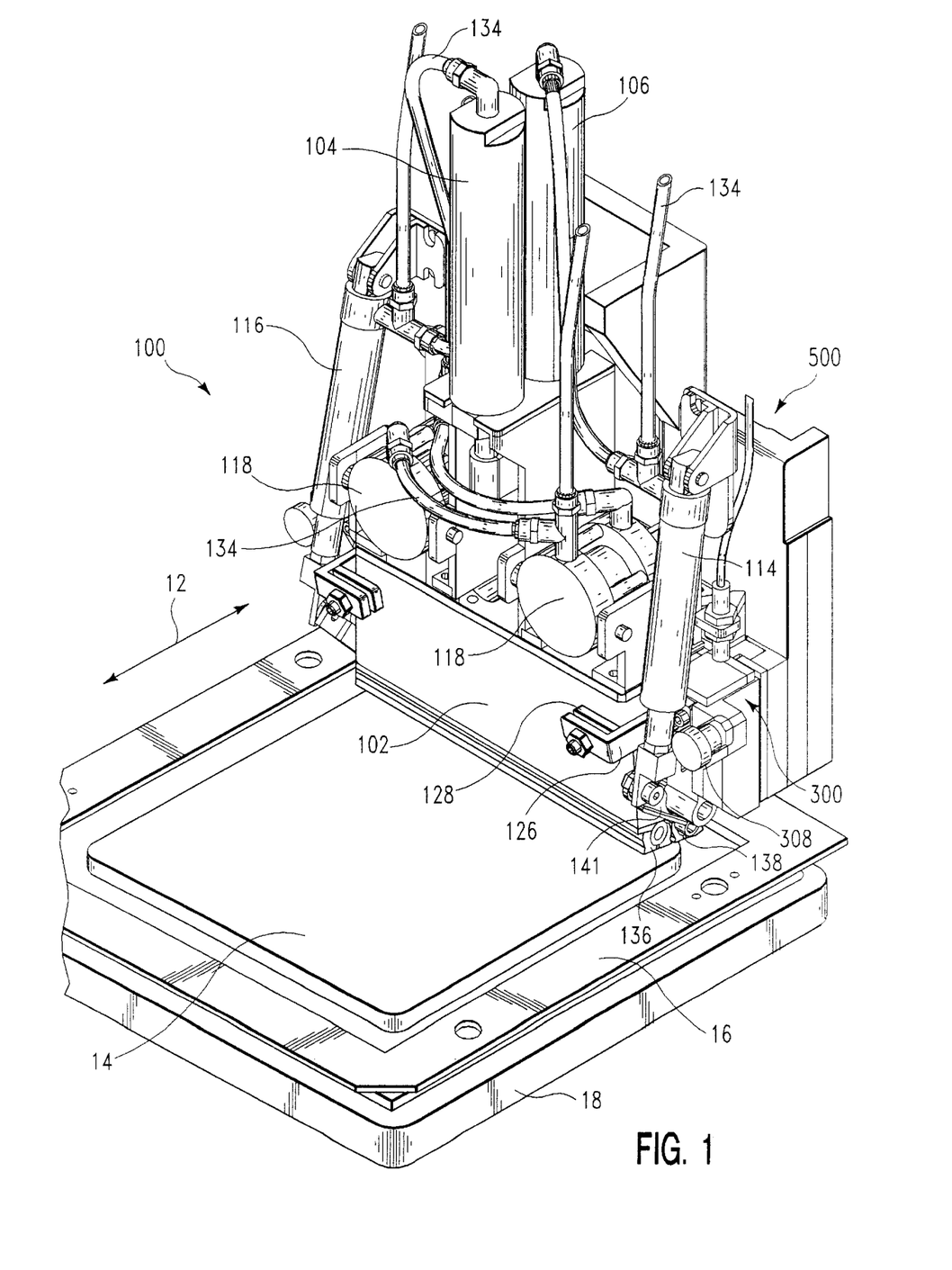
FIG. 1 is a perspective view of a dual reservoir dispensing assembly according to the present invention mounted for use in its screening environment.

Referring now to FIG. 1, there is a perspective view showing the front of the dual reservoir dispensing assembly 100 mounted on assembly carrier 300 which in turn is affixed to rear mounting plate 500. As will be understood by those skilled in the art, rear mounting plate 500 would be further fixtured to the remainder of the screening apparatus. For example, referring to FIG. 6 of the Davis et al. patent, it can be seen that mounting plate 286 is slideably mounted on assembly mounting plate 282 and then to the remainder of the screening apparatus.

The remainder of the screening apparatus is not shown for clarity but normally it would provide conventional translation means to reciprocally translate the dual reservoir assembly 100, assembly carrier 300 and rear mounting plate 500 in the direction of arrows 12, conventional means for placing and removing appropriate screens in position for screening, conventional means for placing and removing greensheets 14 for screening, and conventional electronic means for programming the screening apparatus. The screens are not shown but would normally be held in screen frame 16. Screen frame 16 and greensheet 14 are located on table 18.

Figure 2:
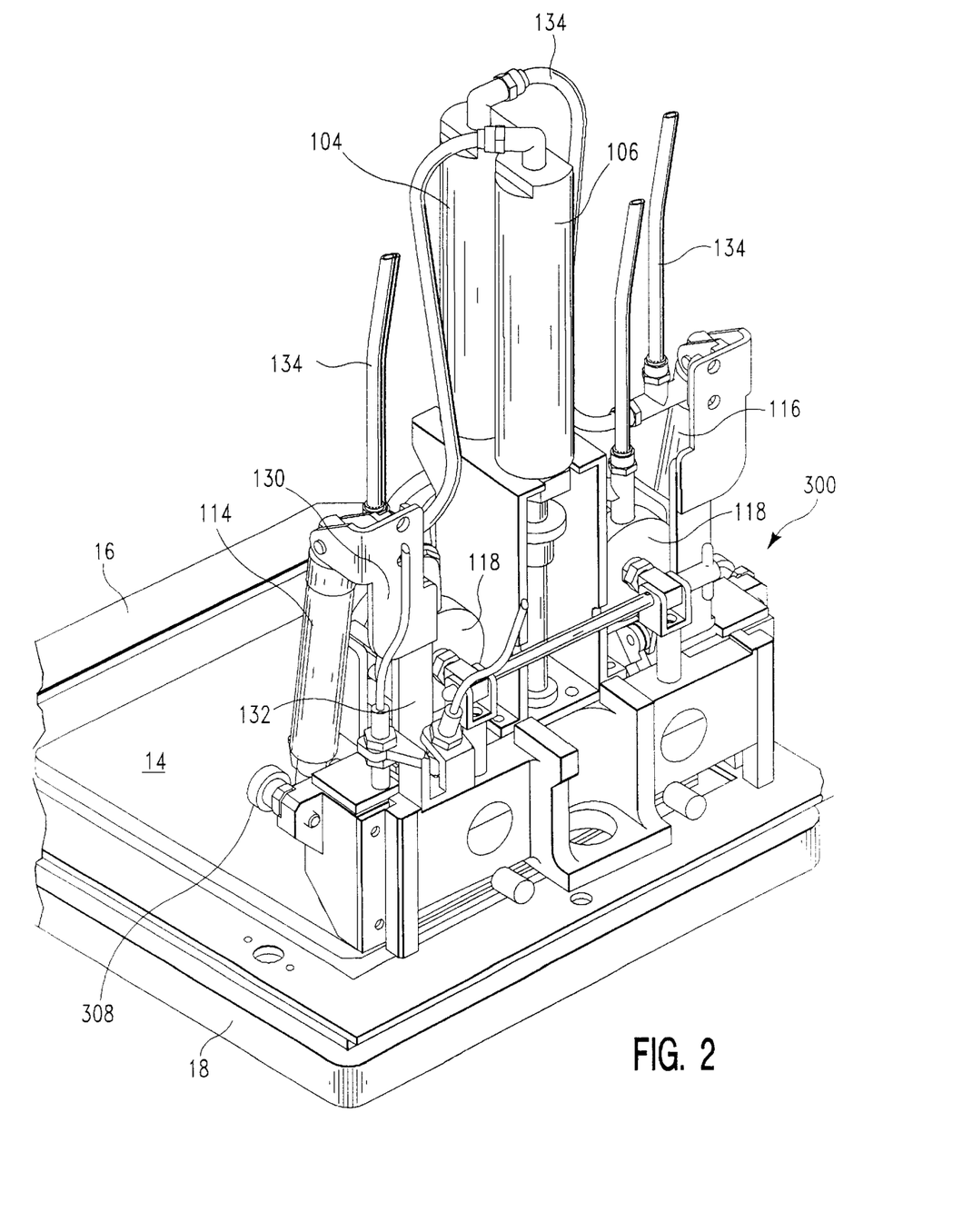
FIG. 2 is another perspective view of the dual reservoir dispensing assembly according to the present invention in its screening environment with the rear mounting plate removed.

FIG. 2 shows the same apparatus as in FIG. 1 but from the back of the dual reservoir dispensing assembly 100 and with rear mounting plate 500 removed.

Figure 3:
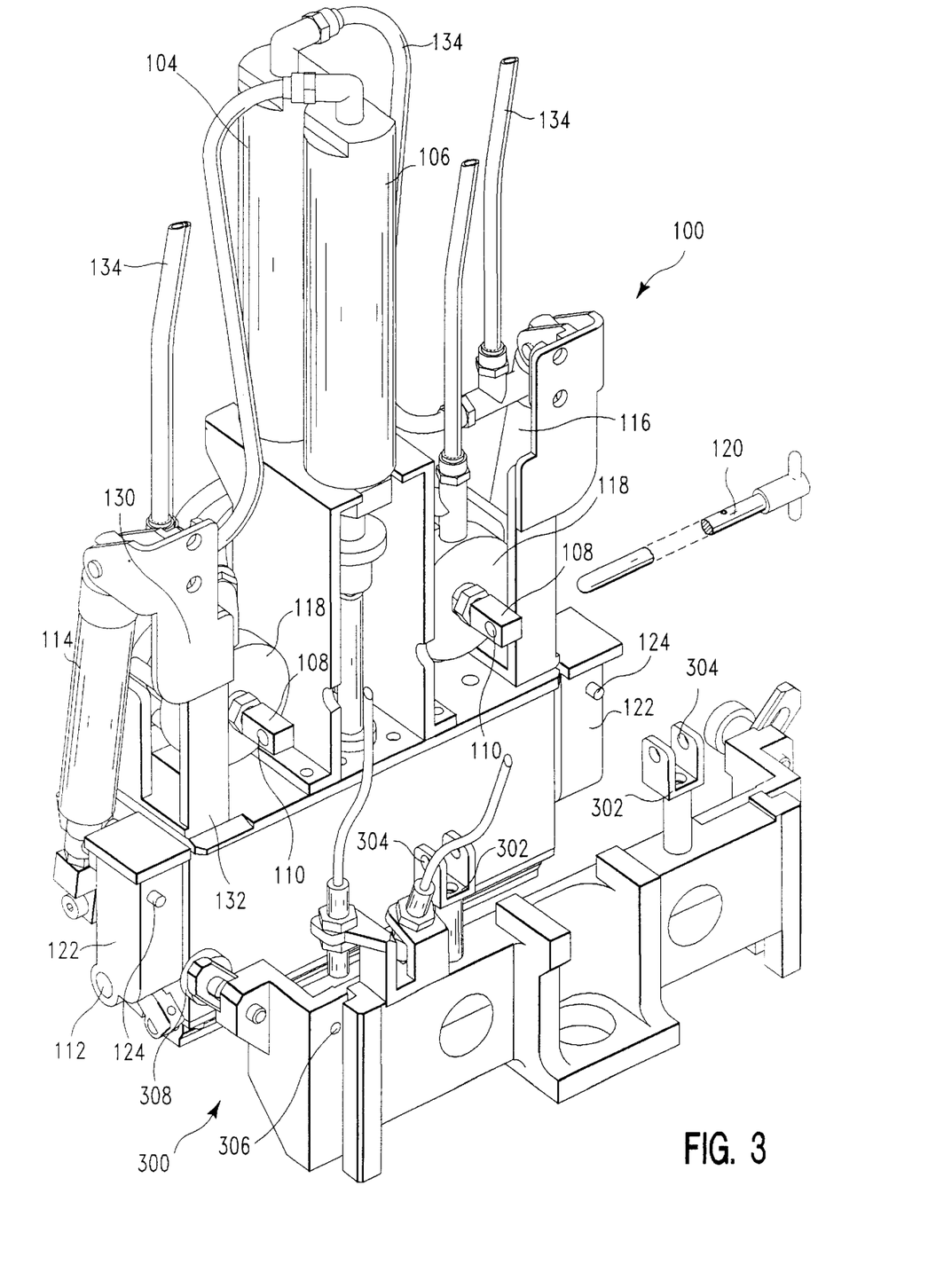
FIG. 3 is an exploded perspective view of the apparatus in FIG. 2 with the assembly carrier separated from the dual reservoir dispensing assembly.

FIG. 3 is a perspective view similar to FIG. 2 but with the assembly carrier 300 separated from the dual reservoir dispensing assembly 100.

referring now to FIGS. 1 to 3, the dual reservoir dispensing assembly 100 will be described in detail. Dual reservoir 102 will be described in more detail hereafter but for now it should be understood that dual reservoir 102 contains reservoirs for two different paste materials and each reservoir contains a nozzle for dispensing the paste material. Air cylinders 114, 116 operate shutters which allow paste material to flow through the nozzles. As best shown in FIG. 3, each of the shutter air cylinders 114, 116 are affixed to the dual reservoir 102 by brackets 130 and 132. Feed cylinders 104, 106 force two different paste materials from the dual reservoir 102. Air cylinders 118 are mounted on the top of dual reservoir 102 for causing the dual reservoir assembly 100 to tilt to a predetermined angle by pivoting at shaft 112. Each tilt air cylinder 118 has an arm 108 with a perforation 110. Appropriate tubing 134 connected to a pneumatic source or sources (not shown) is provided to actuate feed cylinders 104, 106, tilt air cylinders 118 and shutter air cylinders 114, 116.

Referring now particularly to FIG. 3, arms 108 of air cylinders 118 fit within clevises 302 of assembly carrier 300. The perforation 110 in each arm 108 is lined up with perforations 304 in each clevis 302. Retaining pin 120 is then inserted through all of perforations 110 and 304 to firmly affix the air cylinders 118 to assembly carrier 300.

Air cylinders 118 are double acting air cylinders which will enable them to both extend and then retract arms 108 for the purpose of tilting and then untilting the dual reservoir dispensing assembly 100. The same result could be achieved by substituting two single acting air cylinders for each of the double acting air cylinders 118. Air cylinders 118 are preferred because of spatial requirements. However, any mechanical, electrical, hydraulic or pneumatic apparatus that performs the same function as air cylinders 118 could be substituted for air cylinders 118. Among these apparatus are electrically actuated solenoids, mechanical actuators, rack and pinion gearing driven by a small motor and pneumatic actuators.

Continuing to refer to FIG. 3, tilt assemblies 122 each have a pin 124 which is inserted into perforations 306 of assembly carrier 300. Upon insertion of pins 124 into perforations 306, keepers 308 are rotated into position and then tightened to secure the tilt assemblies 122 to assembly carrier 300.

Figure 6:
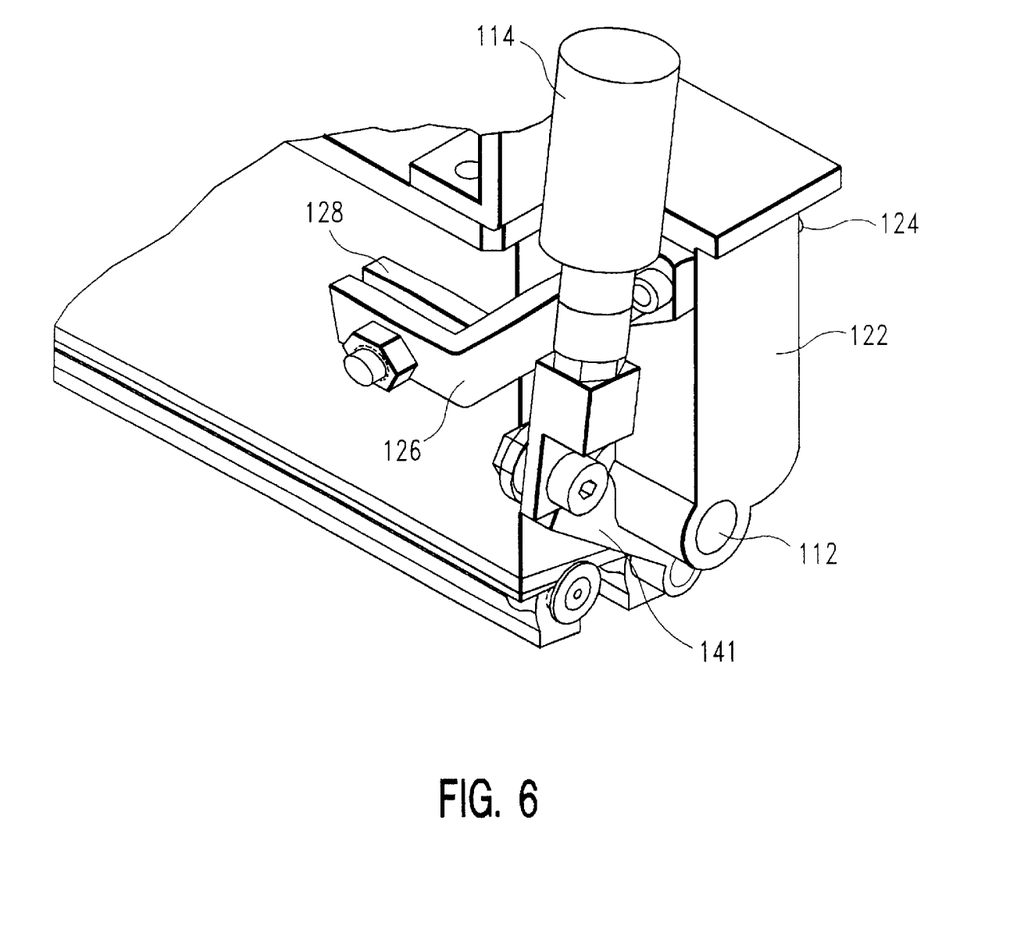
FIG. 6 is a partial perspective view of the dual reservoir dispensing assembly showing the tilt pivot.

The tilt assembly 122 is shown in more detail in FIG. 6. Pivot shaft 112 is slidably inserted within dual reservoir 102 so that dual reservoir 102 may rotate freely with respect to the tilt assembly 122. The tilt assembly further includes bracket 126 with stop 128 which controls the maximum angular rotation of dual reservoir 102.

Figure 4:
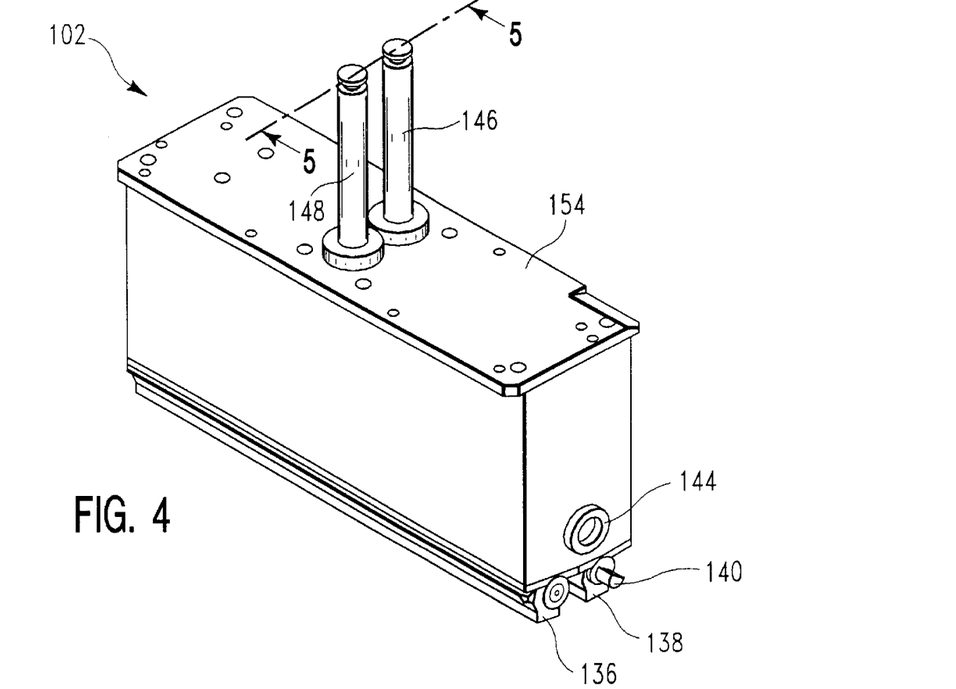
FIG. 4 is a perspective view of the dual reservoir of the dual reservoir dispensing assembly.
Figure 5:
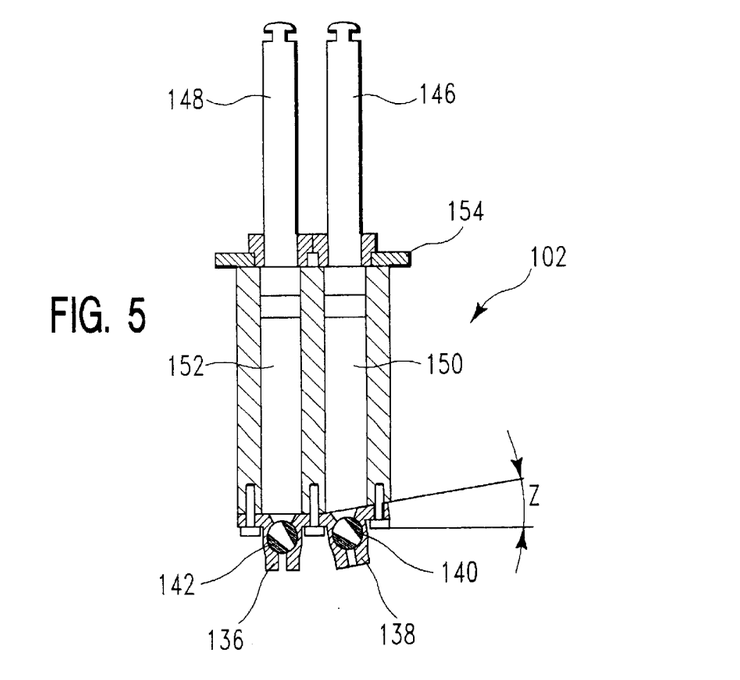
FIG. 5 is a cross sectional view of the dual reservoir of FIG. 4 in the direction of arrows V—V shown in FIG. 4.

Referring now to FIGS. 4 and 5, the dual reservoir 102 is shown in more detail. FIG. 5 is a cross section through dual reservoir 102 in the direction of arrows V—V. The dual reservoir 102 has lid 154 through which protrude piston shafts 146, 148. Pivot bearing 144 receives pivot shaft 112 of tilt assembly 122. Nozzles 136, 138 dispense paste materials from each of the reservoirs 150, 152, respectively. Shutter 140 controls the flow of paste material from reservoir 150 while shutter 142 controls the flow of paste material from reservoir 152. Both of shutters 140, 142 shown in FIG. 5 are in the closed position. Paste material is not shown in the reservoirs 150, 152, or in any of the other Figures, but is deemed to be conventional in nature.

Nozzles 136, 138 may be made of any material suitable for the application. Thus, the material may be compliant or hard. Some compliant materials include, but are not limited to, polyurethane, elastomers, thermoplastics, natural rubber, silicone, TEFLON or other similar materials. Hard materials include tool steels, carbide materials and ceramic materials.

In Applicants' RELATED APPLICATION, it is disclosed therein a process for sequentially depositing two different layers of material. As disclosed therein, a first pass of the screening apparatus partially fills the vias and a second pass of the screening apparatus fills the remainder of the vias. In order to only partially fill the vias, it is preferred to have a compliant nozzle. To fill the remainder of the vias, it is preferred to have a hard nozzle. Accordingly, it is preferred that one of the nozzles 136 or 138 be made of a compliant material while the other of the nozzles 138 or 136 be made of a hard material.

As shown in FIG. 5, the front reservoir or reservoir 152 is positioned to dispense paste material. Upon a predetermined command, shutter air cylinder 116 would actuate shutter 142 into the open position and feed cylinder 104 would actuate piston shaft 148 to cause paste material normally in reservoir 152 to flow out through nozzle 136. When it is desired to dispense paste material from rear reservoir or reservoir 150, the dual reservoir dispensing assembly 100 would be tilted through a predetermined angle Z to bring reservoir 150 into position to dispense paste material. Then, air cylinder 114 would actuate shutter 140 into the open position and feed cylinder 106 would actuate piston shaft 146 to cause paste material normally in reservoir 150 to flow out through nozzle 138.

Referring to FIGS. 5 and 6, shutter air cylinder 114 is connected by linkage 141 to shutter 140. Accordingly, actuation of shutter air cylinder 114 with consequent movement of linkage 141 would cause shutter 140 to rotate into the open or closed position. There is similar linkage on the other end of reservoir 102 to rotate shutter 142.

Angle Z is readily determined by a person skilled in the art and is dictated by mechanical design considerations. The least angle possible would be most desirable. The present inventors believe that angle Z may be in the range of 10 to 30 degrees. For the most preferred application contemplated by the RELATED APPLICATION, 11 degrees is the most preferred for angle Z.

Figure 7A:
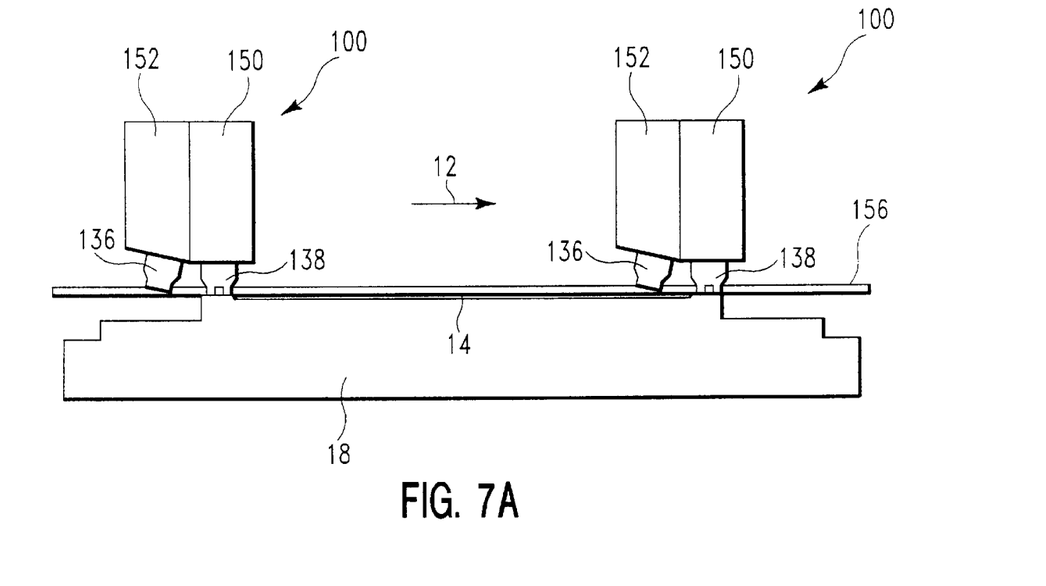
FIGS. 7A and 7B are schematical representations of the operation of the dual reservoir dispensing assembly according to the present invention.

The operation of the dual reservoir dispensing assembly 100 will now be described with reference to FIGS. 7A and 7B and also FIGS. 1 to 3. Referring first to FIG. 7A, the left hand side of the Figure has arbitrarily been chosen as the starting point of the screening process. The direction of movement of the dual reservoir dispensing assembly 100, as indicated by arrow 12 will first be to the right and then back to the left. Paste material from reservoir 150 will be dispensed first. As configured, reservoir 150 is brought into the proper orientation by having dual reservoir dispensing assembly 100 flush against assembly carrier 300, as shown in FIGS. 1 and 2. Feed cylinder 106 is actuated and shutter air cylinder 114 is actuated to open the shutter 140, preferably simultaneously, to cause paste material to move down through the reservoir 150, out through nozzle 138, onto and through screen mask 156 and then onto greensheet 14. The dual reservoir dispensing assembly 100, assembly carrier 300 and rear mounting plate 500 are then translated to the right hand side of FIG. 7A by conventional means not shown but represented by arrow 12 to cause paste material to be dispensed over the desired area of screen mask 156 and greensheet 14. Once the desired paste material has been dispensed (not shown in the Figures), feed cylinder 106 and shutter air cylinder 114 are deactuated, preferably simultaneously, to stop the flow of paste material and close shutter 140.

For the return stroke, it is necessary to orient reservoir 152 into position which occurs by tilting dual reservoir dispensing assembly 100. Air cylinders 118 are actuated to cause arms 108 to push out against devises 304 and retaining pin 120. This causes dual reservoir dispensing assembly 100 to pivot about pivot shaft 112 with respect to assembly carrier 300 and tilt to the desired predetermined angle Z.

Figure 7B:
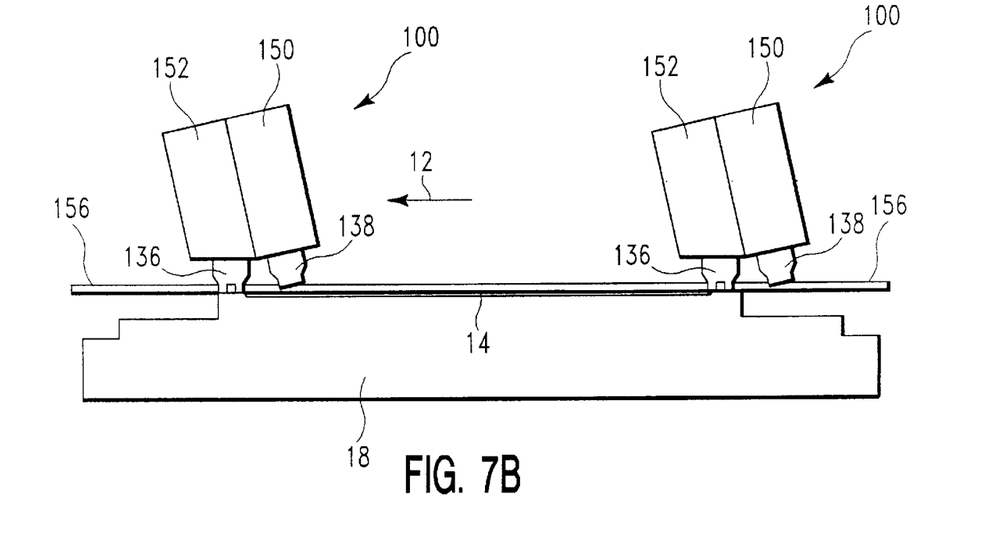

Referring now to FIG. 7B, reservoir 152 is now in the correct orientation for dispensing a paste material through nozzle 136. Now, feed cylinder 104 is actuated and shutter air cylinder 116 is actuated to open the shutter 142, preferably simultaneously, to cause paste material to move down through the reservoir 152, out through nozzle 136, onto and through screen mask 156 and then onto greensheet 14. The dual reservoir dispensing assembly 100, assembly carrier 300 and rear mounting plate 500 are then translated to the left hand side of FIG. 7B by conventional means not shown but represented by arrow 12 to cause paste material to be dispensed over the desired area of screen mask 156 and greensheet 14. Once the desired paste material has been dispensed (not shown in the Figures), feed cylinder 104 and shutter air cylinder 116 are deactuated, preferably simultaneously, to stop the flow of paste material and close shutter 142.

The conventional means to translate the dual reservoir dispensing assembly 100, assembly carrier 300 and rear mounting plate 500 may be any mechanical, electrical, hydraulic or pneumatic apparatus that performs the function of translation as described above. One such conventional means is the screener drive cylinder 278 and cylinder rod 280 connected to the vertical mounting plate 286 shown and described in the Davis et al. patent wherein extension of the cylinder rod 280 causes movement of the paste nozzle across the mask. Another conventional means could be a precision linear actuator in which a rotary stepping motor turns a precision worm screw connected to rear mounting plate 500 to linearly move the dual reservoir dispensing assembly 100, assembly carrier 300 and rear mounting plate 500.

The last step in the operation of the invention is to return the dual reservoir dispensing assembly 100 to its starting orientation which we have arbitrarily chosen to be that shown in the left hand side of FIG. 7A. Accordingly, it becomes necessary to right the dual reservoir dispensing assembly 100 to its vertical orientation. This is accomplished by again actuating air cylinders 118 which cause arms 108 to retract and pull the dual reservoir dispensing assembly against assembly carrier 300 while pivoting about pivot shaft 112.

The dual reservoir dispensing assembly 100 is now ready to screen another greensheet.

Again, it should be understood that the present invention has the capability of screening two different materials on the same greensheet in any desired pattern or overprinting one material directly over another material on consecutive screening passes as the preferred use for purposes of the RELATED APPLICATION. Alternatively, the present invention could be used to screen selected greensheets in the same batch with either of two different materials. In this latter situation, the greensheets would be changed after the operation illustrated in FIG. 7A is completed.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of screening an article with a dual reservoir dispensing assembly comprising a first reservoir for holding a first material to be dispensed; a first nozzle in communication with the first reservoir wherein upon a predetermined command, the first material in the first reservoir is dispensed through the first nozzle; a second reservoir for holding a second material to be dispensed; a second nozzle in communication with the second reservoir wherein upon a predetermined command, the second material in the second reservoir is dispensed through the second nozzle; a tilt means for tilting the nozzles, wherein upon a first predetermined command, the tilt means tilting the nozzles in a first direction so that the first nozzle is tilted into position for dispensing the first material, wherein upon a second predetermined command, the tilt means tilting the nozzles in a second direction so that the first nozzle is tilted out of position and the second nozzle is tilted into position for dispensing the second material, the method comprising the steps of:

placing an article to be screened onto a table;

placing a dual reservoir dispensing assembly into a starting position;

tilting the nozzles so that the first nozzle is tilted into position for dispensing a first material;

traversing the dual reservoir dispensing assembly across the article to be screened in a first direction while dispensing a first material onto the article;

tilting the nozzles so that the second nozzle is tilted into position for dispensing a second material; and traversing the dual reservoir dispensing assembly across the article to be screened in a second direction while dispensing a second material onto the article.

2. The method of claim 1 wherein the first direction is opposite of the second direction.

3. The method of claim 1 wherein the first and second materials are different materials.

4. A screening apparatus comprising:

a table for holding an article; and a dual reservoir dispensing assembly comprising:

a first reservoir for holding a first material to be dispensed;

a first nozzle in communication with the first reservoir wherein upon a predetermined command, the first material in the first reservoir is dispensed through the first nozzle;

a second reservoir for holding a second material to be dispensed;

a second nozzle in communication with the second reservoir wherein upon a predetermined command, the second material in the second reservoir is dispensed through the second nozzle;

a tilt means for tilting the nozzles, wherein upon a first predetermined command, the tilt means tilting the nozzles in a first direction so that the first nozzle is tilted into position for dispensing the first material, wherein upon a second predetermined command, the tilt means tilting the nozzles in a second direction so that the first nozzle is tilted out of position and the second nozzle is tilted into position for dispensing the second material; and means for moving the dual reservoir dispensing assembly with respect to the table wherein, in operation, the first nozzle is tilted into position during a first movement across the article and the second nozzle is titled into position during a second movement across the article.

5. The apparatus of claim 4 wherein the first reservoir is adjacent to the second reservoir.

6. The apparatus of claim 4 further comprising a housing wherein the first reservoir is adjacent to the second reservoir in the housing.

7. The apparatus of claim 4 wherein an angle between the first and second directions of tilting is between 10 and 30 degrees.

8. The apparatus of claim 7 wherein the angle is 11 degrees.

9. The apparatus of claim 4 wherein the second movement is in a direction that is opposite from the first movement.

10. The apparatus of claim 4 wherein the first and second nozzles are slits.

11. The apparatus of claim 4 wherein the first and second materials are different materials.

12. A dual reservoir dispensing assembly comprising:

a first reservoir for holding a first material to be dispensed;

a first nozzle in communication with the first reservoir wherein upon a predetermined command, the first material in the first reservoir is dispensed through the first nozzle;

a second reservoir for holding a second material to be dispensed;

a second nozzle in communication with the second reservoir wherein upon a predetermined command, the second material in the second reservoir is dispensed through the second nozzle;

a tilt means for tilting the nozzles, wherein upon a first predetermined command, the tilt means tilting the nozzles in a first direction so that the first nozzle is tilted into position for dispensing the first material, wherein upon a second predetermined command, the tilt means tilting the nozzles in a second direction so that the first nozzle is tilted out of position and the second nozzle is tilted into position for dispensing the second material.

13. The assembly of claim 12 wherein the first reservoir is adjacent to the second reservoir.

14. The assembly of claim 12 further comprising a housing wherein the first reservoir is adjacent to the second reservoir in the housing.

15. The assembly of claim 12 wherein an angle between the first and second directions of tilting is between 10 and 30 degrees.

16. The assembly of claim 15 wherein the angle is 11 degrees.

17. The assembly of claim 12 wherein the second movement is in a direction that is opposite from the first movement.

18. The assembly of claim 12 wherein the first and second nozzles are slits.

19. The assembly of claim 12 wherein the first and second materials are different materials.

* * * * *